(12) United States Patent
Morozumi

(10) Patent No.: US 6,432,845 B1
(45) Date of Patent: Aug. 13, 2002

(54) SEMICONDUCTOR DEVICE AND METHOD FOR MANUFACTURING THE SAME

(75) Inventor: Yokio Morozumi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/447,994

(22) Filed: Nov. 23, 1999

(30) Foreign Application Priority Data

Nov. 26, 1998 (JP) .......................................... 10-352122

(51) Int. Cl.$^7$ ............................................. H01L 21/461
(52) U.S. Cl. ........................ 438/789; 438/787; 438/638
(58) Field of Search ................................ 438/787, 789, 438/790, 597

(56) References Cited

U.S. PATENT DOCUMENTS 6,091,081 A * 7/2000 Matsubara et al. ............ 257/52
6,104,092 A * 8/2000 Matsubara et al. ......... 257/764
6,121,162 A * 9/2000 Endo .......................... 438/787
6,171,945 B1 * 1/2001 Mandal et al. .............. 438/622

* cited by examiner

*Primary Examiner*—Hoai V. Ho
*Assistant Examiner*—Thao P. Le
(74) *Attorney, Agent, or Firm*—Hogan & Hartson, L.L.P.

(57) ABSTRACT

A semiconductor device has a structure that is capable of reducing warping of a semiconductor wafer when the semiconductor device is manufactured. The semiconductor device is manufactured by a method including the steps for forming an interlayer dielectric film having an internal compression stress and an interlayer dielectric film having an internal tensile stress. As a result, when semiconductor devices are manufactured, the tensile stress and the compression stress act on the semiconductor wafer. As a consequence, the overall stress that acts on the semiconductor wafer are reduced to a small level or to zero, and thus warping of the semiconductor wafer is reduced or eliminated when semiconductor devices are manufactured.

47 Claims, 7 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device having a multiple-wiring-layer structure and a method for manufacturing the same.

2. Description of Related Art

In a semiconductor device having a multiple-wiring-layer structure, insulation between wiring layers is provided by interlayer dielectric films. Techniques for forming interlayer dielectric films are described in, for example, Japanese Laid-open patent applications HEI 7-86284 and HEI 7-161703.

These interlayer dielectric films disclosed in the above references have internal compression stress. This results in warping of a semiconductor wafer when semiconductor devices are manufactured. The warping of the semiconductor wafer creates various problems in manufacturing of semiconductor devices. For example, a semiconductor wafer is mounted on a vacuum chuck while thin films (interlayer dielectric films, metal wiring layers, etc.) are formed. If the semiconductor wafer is warped, heat is not uniformly conducted through the semiconductor wafer. As a result, the thickness of the thin film thus formed is not uniform. In many occasions, many interlayer dielectric films are formed in between the wiring layers. As a result, more wiring layers result in a greater number of interlayer dielectric films. As a consequence, the compression stress in the semiconductor wafer increases, with the result that the warping of the semiconductor wafer becomes greater.

SUMMARY OF THE INVENTION

It is an object of the present invention to provide a semiconductor device having a structure that is capable of reducing warping of a semiconductor wafer when the semiconductor device is manufactured. It is also an object of the present invention to provide a method for manufacturing the same.

In accordance with one embodiment of the present invention, a semiconductor device has a semiconductor substrate having a main surface, at least one wiring layer formed over the main surface, and interlayer dielectric films formed over the at least one wiring layer or between the main surface and the at least one wiring layer. At least one of the interlayer dielectric films includes a first film having an internal tensile stress, and at least another of the interlayer dielectric films includes a second film having an internal compression stress.

In accordance with one embodiment of the present invention, the semiconductor device is manufactured by a method comprising at least the steps of: (a) forming the first film having an internal tensile stress by reacting a silicon compound with hydrogen peroxide by a CVD method; and (b) forming the second film having an internal compression stress by a CVD method.

In accordance with one embodiment of the present invention, in step (a), the first film is a silicon oxide film. When the silicon oxide film is formed by reacting a silicon compound with hydrogen peroxide by a CVD method, the film has an internal tensile stress. On the other hand, in step (b), the second film formed by a CVD method is a silicon oxide film having an internal compression stress. As a result, the tensile stress and the compression stress in the interlayer dielectric films act on the semiconductor wafer when the semiconductor device is manufactured. Accordingly, an overall stress that acts on the semiconductor wafer becomes small or zero (0). Therefore, warping of the semiconductor wafer is reduced or eliminated when the semiconductor device is manufactured. It is noted that step (a) and step (b) can be performed in any order. In other words, step (a) can be performed first, or step (b) can be performed first.

CVD methods that cause internal compression stresses in a formed film include, for example, pyrolysis or hydrolysis of organic oxysilane, and plasma CVD method or reduced pressure CVD method that utilizes oxidation of silane.

After step (b), the interlayer dielectric film including the second silicon oxide film may preferably be polished by chemical-mechanical polishing (CMP). As a result, the interlayer dielectric film including the second silicon oxide film is planarized.

A through hole may be formed in the interlayer dielectric film including the second silicon oxide film. A high melting point metal, such as tungsten, may preferably be used as a conductive layer to fill in the through hole formed in the interlayer dielectric film including the second silicon oxide film.

In step (a), the first silicon oxide film may be formed by reacting a silicon compound and hydrogen peroxide utilizing a CVD method. As a result, the formed layer has an excellent planarization characteristic. More specifically, the first silicon oxide film formed in step (a) has a high flowability itself and a high self-planarization characteristic. This phenomenon is believed to take place due to the following mechanism. When a silicon compound and hydrogen peroxide are reacted by the CVD method, silanol is formed in vapor phase, and the silanol deposits on the surface of the wafer to provide a film having a high flowability.

For example, when monosilane is used as a silicon compound, silanol is formed by reactions defined by formulae (1) and (1)' as follows:

$$SiH_4 + 2H_2O_2 \rightarrow Si(OH)_4 + 2H_2 \quad \text{Formula (1)}$$

$$SiH_4 + 3H_2O_2 \rightarrow Si(OH)_4 + 2H_2O + H_2 \quad \text{Formula (1)'}$$

Silanol formed by the reactions defined by Formulae (1) and (1)' becomes silicon oxide as a result of disconnection of water by polycondensation reaction defined by Formula (2) as follows:

$$Si(OH)_4 \rightarrow SiO_2 + 2H_2O \quad \text{Formula (2)}$$

The silicon compounds include, for example, inorganic silane compounds, such as monosilane, disilane, $SiH_2Cl_2$, $SiF_4$ and the like, and organo silane compounds, such as $CH_3SiH_3$, tripropyle-silane, tetraethylorthosilicate and the like.

The film formation in step (a) described above may preferably be conducted by a reduced pressure CVD method at temperatures of about 0–20° C. when the silicon compound is an inorganic silicon compound, and at temperatures of about 0–150° C. when the silicon compound is an organic silicon compound. If the temperature during the film-forming step is higher than the upper limit of the above-described temperature ranges, the polycondensation reaction defined by Formula (2) progresses excessively. As a result, the flowability of the first silicon oxide film lowers and therefore it is difficult to obtain good planarization. On the other hand, if the temperature is lower than the lower limit of the above-described temperature ranges, the control of a film forming apparatus becomes difficult. For example, adsorption of cracked water content occurs within the chamber and dew condensation occurs outside the chamber.

The first silicon oxide film formed in step (a) may preferably be formed with a thickness that sufficiently covers step differences of the underlying layer. The minimum thickness of the first silicon oxide film depends on the height of protrusions and recesses of the underlying layer, and is preferably between about 300 and about 1000 nm. If the film thickness of the first silicon oxide film exceeds over the above-described upper limit, cracks may occur due to stresses of the film itself.

The interlayer dielectric film in accordance with embodiments of the present invention may have a single layered structure or a multiple layered structure. In the case of a multiple layered structure having multiple interlayer dielectric films, one of the interlayer dielectric films may have an internal compression stress and another of the layers may have an internal tensile stress. As a result, the interlayer dielectric films in the multiple layered structure as a whole may have an internal tensile stress or an internal compression stress.

In accordance with another embodiment of the present invention, a semiconductor device comprises a semiconductor substrate having a main surface, a plurality of wiring layers over the main surface, and interlayer dielectric films formed between the main surface and the plurality of wiring layers and between the wiring layers. At least one of the interlayer dielectric films includes a first silicon oxide film being formed by reacting a silicon compound with hydrogen peroxide through polycondensation reaction and having an internal tensile stress. At least another of the interlayer dielectric films includes a second silicon oxide film having an internal compression stress.

It is noted that the interlayer dielectric films having an internal compression stress are intended to merely provide a semiconductor device structure with an internal compression stress. Accordingly, another insulation film having an internal compression stress may be used to provide an internal compression stress, instead of the second silicon oxide film.

In a method for manufacturing a semiconductor device in accordance with one embodiment of the present invention, the step of forming the interlayer dielectric film including the first silicon oxide film includes, before step (a), step (c) of reacting a silicon compound with at least one of oxygen and a compound including oxygen through a CVD method to form a third silicon oxide film that serves as a base layer.

In step (c), the third silicon oxide film, that serves as a base layer, is formed by reacting a silicon compound with at least one of oxygen and a compound including oxygen by a CVD method. The base layer has a passivation function that prevents migration of water and excess impurities from the first silicon oxide film to an underlying layer below the base layer (a main surface of a semiconductor substrate when there is no underlying layer). Also, the base layer has a function to increase the cohesiveness between the first silicon oxide film and an underlying layer below the base layer (a main surface of a semiconductor substrate when there is no underlying layer).

In accordance with one embodiment of the present invention, a tapered through hole is formed in the interlayer dielectric film including the first silicon oxide film. In a preferred embodiment, the tapered through hole has aperture diameters that gradually reduce from an upper end section to a bottom section of the through hole.

Preferably, the etching speed for the first silicon oxide film is slightly greater than the etching speed for the third silicon oxide film that forms a base layer. As a result, the through hole has an adequate linear taper wall. An aluminum film or an aluminum alloy film can be filled in such a tapered through hole by sputtering, for example. As a result, a contact structure with an excellent conductivity is formed.

The through hole may be formed by an anisotropic dry etching. Also, a tapered through hole having an upper end section with a curved surface may be formed by a combination of an isotropic wet etching and an anisotropic dry etching.

A first aluminum film composed of aluminum or an alloy containing aluminum as a main component may be preferably formed in the through hole at temperatures of about 200° C. or lower. Then, a second aluminum film composed of aluminum or an alloy containing aluminum as a main component may preferably be formed at temperatures of about 300° C. or higher.

The alloy containing aluminum as a main component may be a two-component or a three-component alloy containing at least one selected from copper, silicon, germanium, magnesium, cobalt and beryllium.

When a gettering effect is required to get alkali-ions, an impurity such as for example phosphorous in the amount of about 1–6 weight % may be added to the third silicon oxide film that forms the base layer. Alternatively, for example, a PSG film containing phosphorous in the amount of about 1–6 weight % may be formed between the third silicon oxide film and the first silicon oxide film.

In accordance with one embodiment of the present invention, a semiconductor device manufactured by the manufacturing method described above comprises a semiconductor substrate having a main surface, a plurality of wiring layers over the main surface, and interlayer dielectric films formed between the main surface and the plurality of wiring layers and/or between adjacent ones of the wiring layers. At least one of the interlayer dielectric films includes a third silicon oxide film that serves as a base layer, and a first silicon oxide film above the third silicon oxide film. The first silicon oxide film is formed by reacting a silicon compound with hydrogen peroxide through a polycondensation reaction and has an internal tensile stress. Also, at least another of the interlayer dielectric films includes a second silicon oxide film having an internal compression stress.

In a preferred embodiment, the step of forming the interlayer dielectric film including the first silicon oxide film may preferably include, after step (a), step (d) of forming a fourth porous silicon oxide film by reacting a silicon compound with oxygen or a compound containing oxygen.

In step (d), a silicon compound is reacted with at least one of oxygen and a compound containing oxygen by a CVD method to form a fourth porous silicon oxide film over the first silicon oxide film. The fourth silicon oxide film functions as a cap layer. An impurity such as, for example, phosphorous, boron or the like may preferably be added to the fourth silicon oxide film. More preferably, phosphorous is added to the fourth silicon oxide film. As a result, in addition to its porous structure, the film can relieve stresses by weakening the molecular bonding force between Si and O molecules of the silicon oxide that forms the film. In other words, the layer is moderately soft but hard enough to resist to cracks. One important role of the fourth silicon oxide film is a function in which the impurity such as phosphorous contained in the silicon oxide film functions as a getter of mobile ions, such as alkali-ions that have deteriorating effects on the device element-reliability characteristics. The impurity concentration of the impurity contained in the fourth silicon oxide film may preferably be about 1–6 wt %, in consideration of the gettering function and the stress relieving function of the film.

Also, the fourth silicon oxide film has a compression stress of about 100–600 MPa, and therefore functions to prevent the generation of cracks due to an increased tensile stress that is caused in the first silicon oxide film when it undergoes polycondensation reaction. Further, the fourth silicon oxide film functions to prevent the first silicon oxide film from absorbing moisture.

Step (d) may preferably be conducted by a plasma CVD method with a high frequency at temperatures of about 300–450° C. This step is effective in disconnecting water content from the first silicon oxide film 42.

The compound including oxygen that is used in step (d) may preferably be nitrogen monoxide ($N_2O$). By the use of nitrogen monoxide as a reactant gas, the nitrogen monoxide in a plasma form likely reacts with the hydrogen bond (—H) of the silicon compound that forms the first silicon oxide film. As a result, disconnection of gasification components (hydrogen, water) from the first silicon oxide film is promoted even while the fourth silicon oxide film is being formed.

Alternatively, a normal pressure CVD method at temperatures of about 300–550° C. may be conducted, instead of the plasma CVD method in step (d). In this case, ozone may preferably be used in step (d) as a compound including oxygen.

Also, before the fourth silicon oxide film is formed in step (d), the first silicon oxide film may preferably be exposed to an ozone atmosphere. Since ozone likely reacts with hydrogen bond (—H) and hydroxyl (—OH) of the silicon compound that forms the first silicon oxide film, disconnection of hydrogen and water from the first silicon oxide film is promoted.

The thickness of the fourth silicon oxide film is preferably about 100 nm or greater in consideration of the planarization and prevention of cracks.

A tapered through hole may be formed in the interlayer dielectric films including the first silicon oxide film and the fourth silicon oxide film. In a preferred embodiment, the tapered through hole has aperture diameters that gradually reduce from an upper end section to a bottom section of the through hole. The etching speed for the first silicon oxide film is slightly slower than the etching speed for the fourth silicon oxide film, and the first silicon oxide film and the fourth silicon oxide film are bonded to each other well at their boundary. As a result, the through hole has an adequate linear taper wall without step differences at the boundary between the first silicon oxide film and the fourth silicon oxide film. An aluminum film or an aluminum alloy film can be filled in such a tapered through hole by sputtering, for example. As a result, a contact structure with an excellent conductivity is formed.

The through hole described above may be formed by an anisotropic dry etching. Also, a tapered through hole having an upper end section with a curved surface may be formed by a combination of an isotropic wet etching and an anisotropic dry etching.

Further, a first aluminum film composed of aluminum or an alloy containing aluminum as a main component may preferably be formed in the above-described through hole at temperatures of 200° C. or lower. Then, a second aluminum film composed of aluminum or an alloy containing aluminum as a main component may preferably be formed at temperatures of about 300° C. or higher.

The alloy containing aluminum as a main component may be a two-component or a three-component alloy containing at least one selected from copper, silicon, germanium, magnesium, cobalt and beryllium.

In accordance with one embodiment of the present invention, a semiconductor device manufactured by the manufacturing method described above comprises a semiconductor substrate having a main surface, a plurality of wiring layers over the main surface, and interlayer dielectric films formed between the main surface and the plurality of wiring layers and between the wiring layers. At least one of the interlayer dielectric films includes a first silicon oxide film being formed by reacting a silicon compound with hydrogen peroxide through polycondensation reaction and having an internal tensile stress, and a fourth silicon oxide film that functions as a cap layer formed over the first silicon oxide film. At least another of the interlayer dielectric films includes a second silicon oxide film having an internal compression stress.

In accordance with one embodiment of the present invention, a method for manufacturing a semiconductor device may preferably further include the following steps after the interlayer dielectric film including the first silicon oxide film is formed: (e) forming a first through hole in the interlayer dielectric film including the first silicon oxide film; (f) forming a barrier layer, that defines a part of the wiring layers, on a surface of the first through hole and on a surface of the interlayer dielectric film; and (g) forming a conductive film, that defines a part of the wiring layers, on a surface of the barrier layer. As a result, the interlayer dielectric film including the first silicon oxide film has a portion defining the first through hole. As a result, the semiconductor device includes the barrier layer, that defines a part of the wiring layers, on surfaces of the first through hole and the interlayer dielectric film, and the conductive film, that defines a part of the wiring layers, on a surface of the barrier layer.

The first through hole may preferably be filled with a conductive film composed of aluminum or an alloy containing aluminum as a main component. Also, a second through hole may preferably be formed in the interlayer dielectric film having an internal compression stress. The second through hole may preferably be filled with a conductive film composed of a high melting point metal or an alloy containing a high melting point metal as a main component.

Other features and advantages of the invention will be apparent from the following detailed description, taken in conjunction with the accompanying drawings which illustrate, by way of example, various features of embodiments of the invention.

PREFERRED EMBODIMENTS

Figure 1:
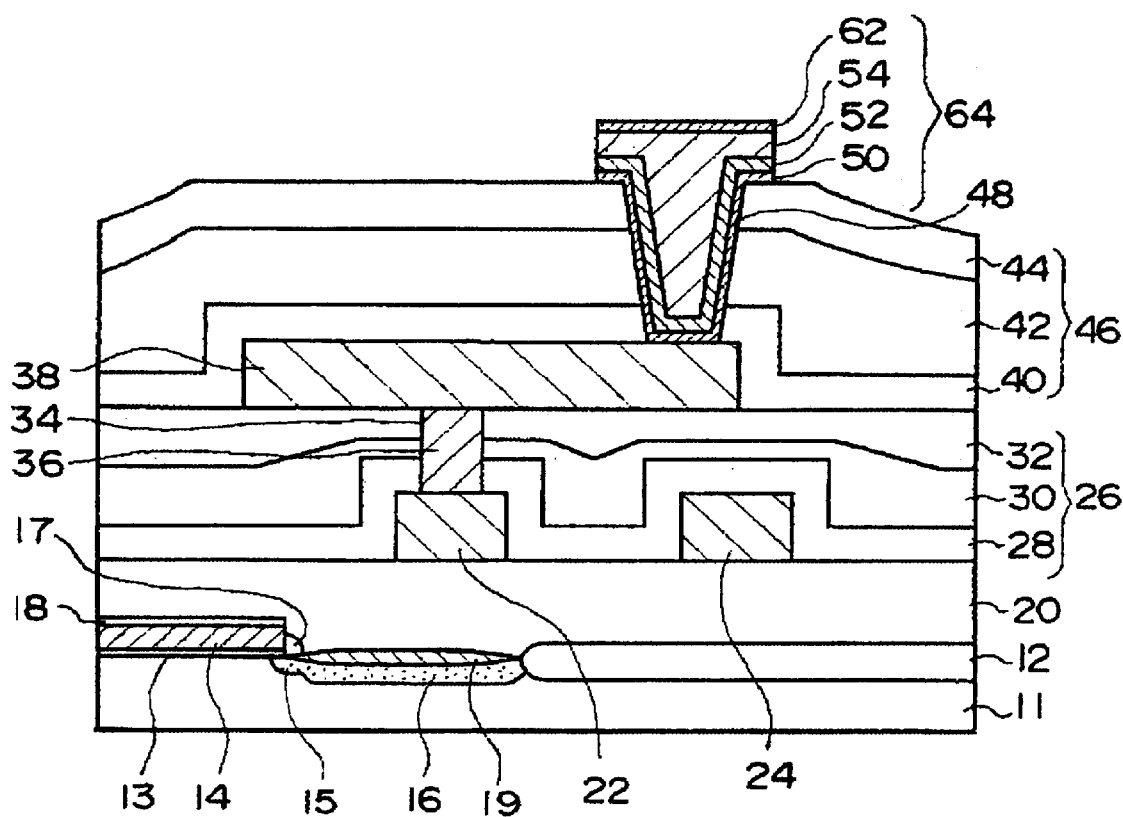
FIG. 1 is a cross sectional view of a structure of a semiconductor device in accordance with a first embodiment of the present invention.

FIG. 1 is a cross-sectional view of a structure of a semiconductor device in accordance with a first embodiment of the present invention. First, the structure of the semiconductor device in accordance with the first embodiment of the present invention is briefly described. A silicon substrate 11 has a main surface, and on the main surface a MOS field effect transistor having a gate electrode 14 is formed. An interlayer dielectric film 20 is formed on the main surface of the silicon substrate 11 such that it covers the MOS field effect transistor. First metal wiring layers 22 and 24, which are spaced from each other, are formed on the interlayer dielectric film 20.

An interlayer dielectric film 26 is formed on the interlayer dielectric film 20 such that it covers the first metal wiring layers 22 and 24. The interlayer dielectric film 26 has an internal compression stress. A second metal wiring layer 38 is formed on the interlayer dielectric film 26. The first metal wiring layer 22 and the second metal wiring layer 38 are electrically connected to each other by a plug 36 including tungsten.

An interlayer dielectric film 46 is formed on the interlayer dielectric film 26 such that it covers the second metal wiring layer 38. The interlayer dielectric film 46 has an internal tensile stress. A third metal wiring layer 64 is formed on the interlayer dielectric film 46. The second metal wiring layer 38 and the third metal wiring layer 64 are electrically connected to each other by a conductive film including an aluminum film.

A method for manufacturing a semiconductor device in accordance with a first embodiment of the present invention will be described. The method will be described step by step with reference to FIGS. 2–8 that illustrate cross-sections of the structure.

Figure 2:
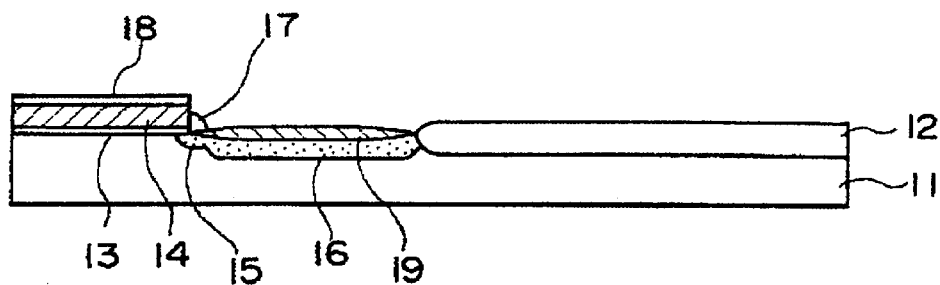
FIG. 2 shows a first step in a process for making a semiconductor device in cross-section in accordance with the first embodiment of the present invention.

A MOS element is formed on a silicon substrate 11 by a commonly practiced method, as shown in FIG. 2. More specifically, for example, a field insulation film 12 is formed on the silicon substrate 11 by selective oxidation, and a gate oxide film 13 is formed in an active region. A threshold voltage level is adjusted by channel injection, then a tungsten silicide is sputter-deposited on a polysilicon layer that is grown by thermally decomposing $SiH_4$. Further, a silicon oxide film 18 is deposited thereon. The layers are etched to a specified pattern to form a gate electrode 14.

Then, phosphorous is ion-implanted to form a low concentration impurity layer 15 for a source region or a drain region. A side-wall spacer 17 of a silicon oxide film is formed on a side of the gate electrode 14. Then arsenic is ion-implanted, and the impurity is activated by an anneal treatment using a halogen lamp to thereby form a high impurity concentration layer 16 for the source region or the drain region.

Next, a CVD silicon oxide film having a film thickness of about 100 nm or less is formed, and the film is selectively etched by a mixed solution of HF and $NH_4F$ to expose designated areas of the silicon substrate. Then, for example, titanium is sputtered to a film thickness of about 30–100 nm, and a rapid anneal is conducted for about several seconds to 60 seconds at temperatures of about 650–750° C. in an nitrogen atmosphere in which oxygen content is controlled to about 50 ppm or less. As a result, a layer of titanium monosilicide is formed on exposed surfaces of the silicon substrate, and a layer of titanium nitride (TiN) that is rich in titanium is formed on the silicon oxide layer 18. When immersed in a mixed solution of $NH_4OH$ and $H_2O_2$, the titanium nitride layer is etched and removed, and the titanium monosilicide layer remains only on the main surface of the silicon substrate. Further, lamp anneal is performed at temperatures of about 750–850° C. to change monosilicide of the monosilicide layer to disilicide, such that a titanium silicide layer 19 is formed on the surface of the high concentration impurity layer 16 in a self-alignment manner.

If the gate electrode 14 is formed only with polysilicon and a selective etching is performed, the gate electrode and source/drain regions are separated from one another by a side wall spacer, in other words, a titanium salicide structure is formed.

The salicide structure may be formed from a tungsten silicide or a molybdenum silicide, instead of the titanium silicide.

Figure 3:
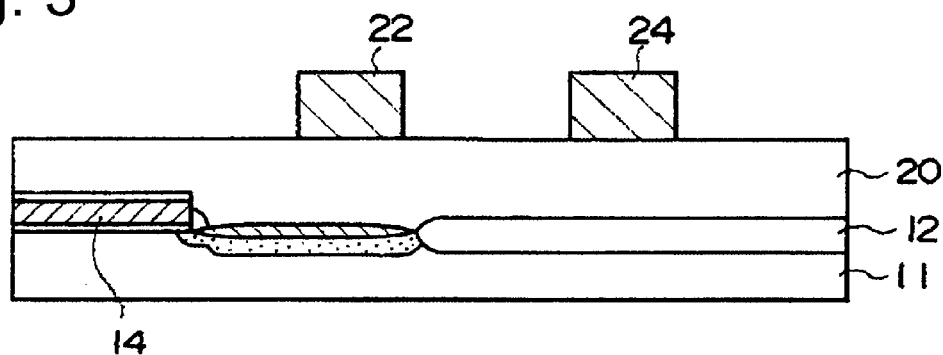
FIG. 3 shows a second step in the process for making the semiconductor device in cross-section in accordance with the first embodiment of the present invention.

Then, referring to FIG. 3, an interlayer dielectric film 20 including a silicon oxide film is formed by, for example, a CVD method. Known film forming conditions may be used for forming the film. The interlayer dielectric film 20 may have a single-layer structure or a multiple-layer structure.

Then, first metal wiring layers 22 and 24 including aluminum films are formed by, for example, sputtering, on the interlayer dielectric film 20. The first metal wiring layers 22 and 24 may have a single-layer structure or a multiple-layer structure.

Figure 4:
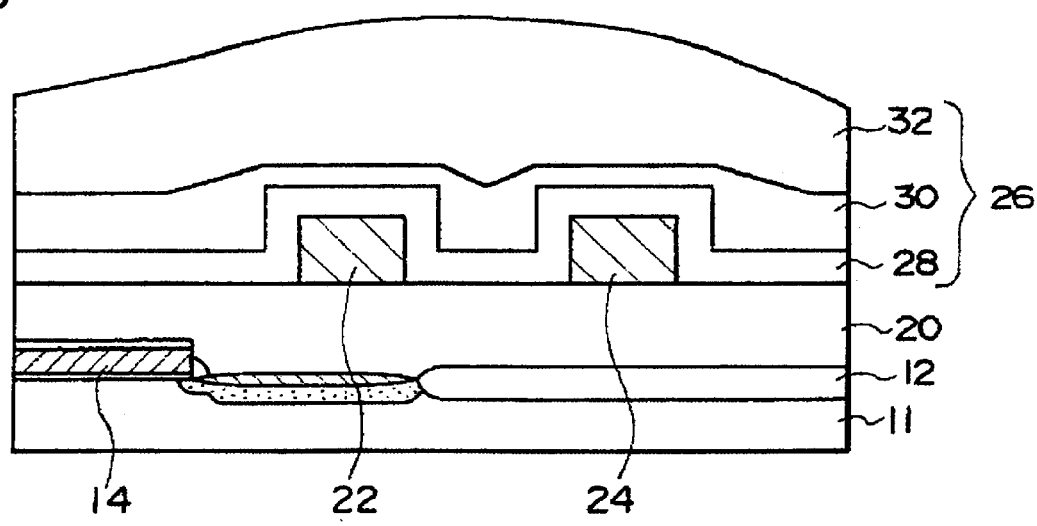
FIG. 4 shows a third step in the process for making the semiconductor device in cross-section in accordance with the first embodiment of the present invention.

Referring to FIG. 4, a silicon oxide film 28 having a film thickness of about 50–600 nm on the interlayer dielectric film 20 is formed such that it covers the first metal wiring layers 22 and 24. For example, the silicon oxide film 28 is formed by reacting tetraethylorthosilicate (TEOS) or $SiH_4$ with oxygen and nitrogen monoxide using plasma CVD method.

An organic solution containing silicon is spin-coated on the silicon oxide film 28, and a heat treatment is conducted. By this step, a SOG film 30 is formed on the silicon oxide film 28. The amount of the SOG film 30 is equivalent to an amount of the SOG film having a film thickness of about 100–400 nm formed on a bare substrate.

Then, a silicon oxide film 32 is formed to a film thickness of about 500–1200 nm on the SOG film 30. In order to reduce step differences on the underlying layer, the silicon oxide film 32 is relatively thick. The silicon oxide film 32 is formed by reacting tetraethylorthosilicate (TEOS) or $SiH_4$ with oxygen and nitrogen monoxide using plasma CVD method. As a result, the interlayer dielectric film 26 is formed. The silicon oxide films 28 and 32 have an internal compression stress. Accordingly, the silicon oxide films 28 and 32 correspond to the second silicon oxide film. The SOG film 30 may have no internal stress or a very small internal tensile stress. As a result, the interlayer dielectric film 26, as a whole, has an internal compression stress.

Figure 5:
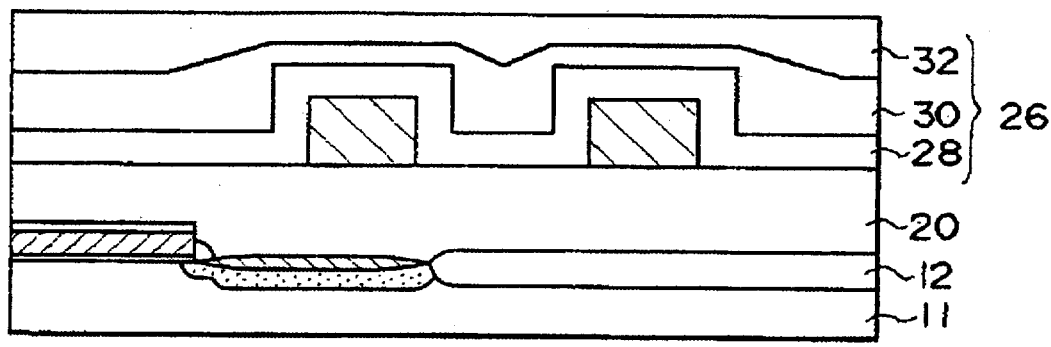
FIG. 5 shows a fourth step in the process for making the semiconductor device in cross-section in accordance with the first embodiment of the present invention.

Referring to FIG. 5, the silicon oxide film 32 (and the SOG film 30, if required) is polished to a predetermined thickness by chemical-mechanical polishing (CMP method), such that the interlayer dielectric film 26 is planarized. Known conditions for the CMP method are used.

Figure 6:
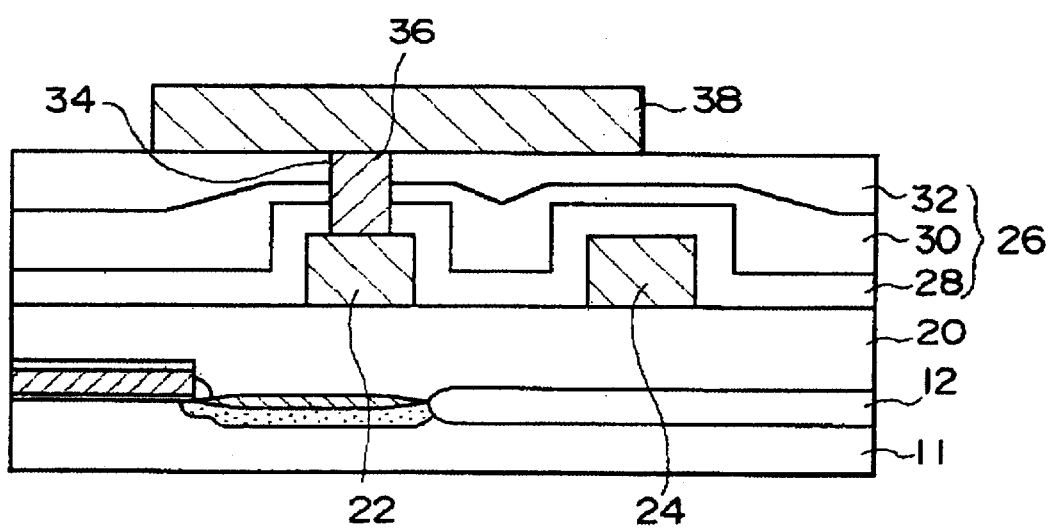
FIG. 6 shows a fifth step in the process for making the semiconductor device in cross-section in accordance with the first embodiment of the present invention.

Referring to FIG. 6, the interlayer dielectric film 26 is selectively etched (for example, by anisotropic dry etching) and removed to form a through hole 34 that exposes a part of the first metal wiring layer 22.

A plug 36 is then formed to fill the through hole 34. A method of forming the plug 36 is described in detail below. First, a Ti film or TiN film is formed on surfaces of the interlayer dielectric film 26 and the through hole 34 by, for example, sputtering method. The Ti film or TiN film has an excellent coherency with the silicon oxide film. Then, a tungsten film is formed on the interlayer dielectric film 26 by a CVD method such that the through hole 34 is filled with the tungsten film. The tungsten film and the Ti film (TiN film) on the interlayer dielectric film 26 are etched back, such that the plug 36 that fills the through hole 34 is completed.

A second metal wiring layer 38 including an aluminum film is formed on the interlayer dielectric film 26 by, for example, a sputtering method. The second metal wiring layer 38 may have a single-layer structure or a multiple-layer structure.

Figure 7:
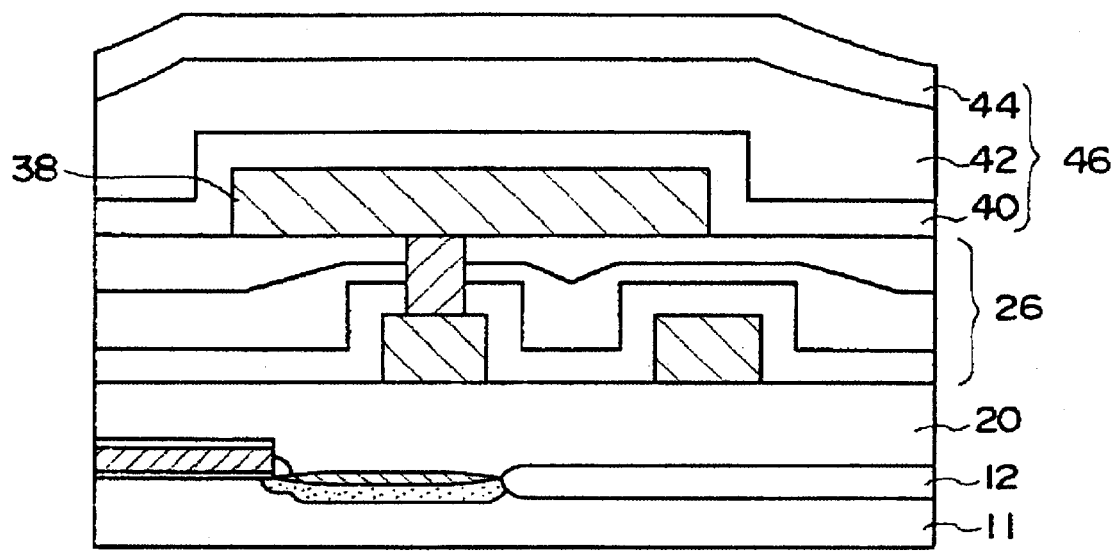
FIG. 7 shows a sixth step in the process for making the semiconductor device in cross-section in accordance with the first embodiment of the present invention.

Referring to FIG. 7, a third silicon oxide film 40 having a film thickness of about 50–200 nm is formed by reacting tetraethylorthosilicate (TEOS) with oxygen at temperatures of about 300–500° C. using plasma CVD method. The silicon oxide film 40 does not cause oxidation or cusping of the second metal wiring layer 38, and has a greater insulation, a slower etching speed against a hydrogen fluoride solution, and a higher density than a layer that is grown from $SiH_4$.

Then, a first silicon oxide film 42 is formed by a CVD method through reaction between $SiH_4$ and $H_2O_2$ using nitrogen gas as a carrier under a reduced pressure of about $2.5 \times 10^2$ Pa or lower in accordance with a preferred embodiment, and more preferably about $0.3 \times 10^2$–$2.0 \times 10^2$ Pa. The first silicon oxide film 42 has a film thickness that is greater than at least a step difference in the third silicon oxide film 40. In other words, the first silicon oxide film 42 is formed to have a film thickness that sufficiently covers a step difference in the underlying film. A maximum film thickness of the first silicon oxide film 42 is set such that cracks are not generated in the film. For example, the film thickness of the first silicon oxide film 42 is preferably greater than a step difference in the underlying layer to achieve an optimum planarization, and may preferably be in a range between about 500 and about 1000 nm.

Film formation temperature of the first silicon oxide film 42 depends on its flowability during the film formation thereof. A high film formation temperature lowers the flowability of the film and deteriorates the planarization. Accordingly, in a preferred embodiment, the film formation temperature is set at about 0–20° C., and more preferably at about 0–10° C.

The flow quantity of $H_2O_2$ is not particularly restricted to a specified level. However, for example, the flow quantity may preferably be set at a concentration ratio of about 55–65 volume %, and twice or more as that of $SiH_4$. In one embodiment, for example, the flow quantity of $H_2O_2$ is preferably set at a gas flow rate ranging from about 100 to about 1000 SCCM, in consideration of uniformity of the film and through-put.

The first silicon oxide film 42 formed in this step is in the form of silanol polymer, has a high level of flowability and a high level of self-planarization characteristic. Also, the first silicon oxide film 42 has a high level of moisture absorption capability due to numerous hydroxyl (—OH) contained therein.

Next, the substrate is left in the chamber under a reduced pressure for 30–120 seconds to remove some water content from the first silicon oxide film 42. Then, plasma CVD is successively conducted with the presence of $SiH_4$, $PH_3$ and $N_2O$ gases at temperatures of about 300–450° C. at high frequencies of 200–600 kHz. As a result, the gases react with one another and form a PSG film (fourth silicon oxide film) 44 having a film thickness of about 100–600 nm. In a preferred embodiment, the fourth silicon oxide film 44 is successively formed after film formation of the first silicon oxide film 42 in consideration of high moisture absorption capability of the first silicon oxide film 42. Alternatively, the fourth silicon oxide film 44 may be formed after the first silicon oxide film 42 is reserved in an atmosphere that does not contain water.

The fourth silicon oxide film 44 needs to be porous such that gasification components such as water and hydrogen contained in the first silicon oxide film 42 are readily and thoroughly removed in an anneal treatment that is later performed. Accordingly, the fourth silicon oxide film 44 is preferably formed by a plasma CVD method at frequency of about 1 MHz or lower and, more preferably at frequency of about 200–600 kHz, and at temperatures of about 450° C. or lower and, more preferably at temperatures of about 300–400° C. Also, in a preferred embodiment, the fourth silicon oxide film 44 contains an impurity such as phosphorous. When the fourth silicon oxide film 44 contains such an impurity, the fourth silicon oxide film 44 becomes more porous, with the result that stresses of the film are alleviated, and the film obtains a gettering effect with respect to alkali ions. The level of concentration of the impurity is determined in consideration of the gettering effect and resistance to stresses. For example, when phosphorous is added as an impurity, the concentration level thereof may preferably be set at about 2–6 weight %.

Also, $N_2O$ is used as a compound containing oxygen in plasma CVD. The use of $N_2O$ promotes separation of hydrogen bonds in the first silicon oxide film 44. As a result, gasification components such as water and hydrogen contained in the first silicon oxide film 42 are removed more securely.

The film thickness of the fourth silicon oxide film 44 is determined in consideration of its role of adjusting the required thickness of the interlayer dielectric film and the function of $N_2O$ that promotes separation of hydrogen bonds. In a preferred embodiment, the fourth silicon oxide film 44 may have a film thickness of 100 nm or greater and, more preferably a film thickness of about 200–600 nm.

Then, anneal treatment is conducted in a nitrogen atmosphere (or in a nitrogen atmosphere with hydrogen added thereto) at temperatures of about 350–450° C. By this anneal treatment, the first silicon oxide film 42 and the fourth silicon oxide film 44 are densified and have good insulation and water-resistance characteristics. When the annealing temperature is set at about 350° C. or higher, polycondensation reaction of silanol in the first silicon oxide film 42 is almost perfectly completed, such that water and hydrogen contained in the film are sufficiently discharged and the film is densified. The annealing temperature set at about 450° C. or lower does not cause deteriorating effects on an aluminum film that forms the second metal wiring layer 38.

In the anneal treatment, the wafer temperature is elevated continuously or in stages in order to reduce effects of thermal strains against the first silicon oxide film 42. In other words, a ramping anneal is preferably conducted.

Figure 8:
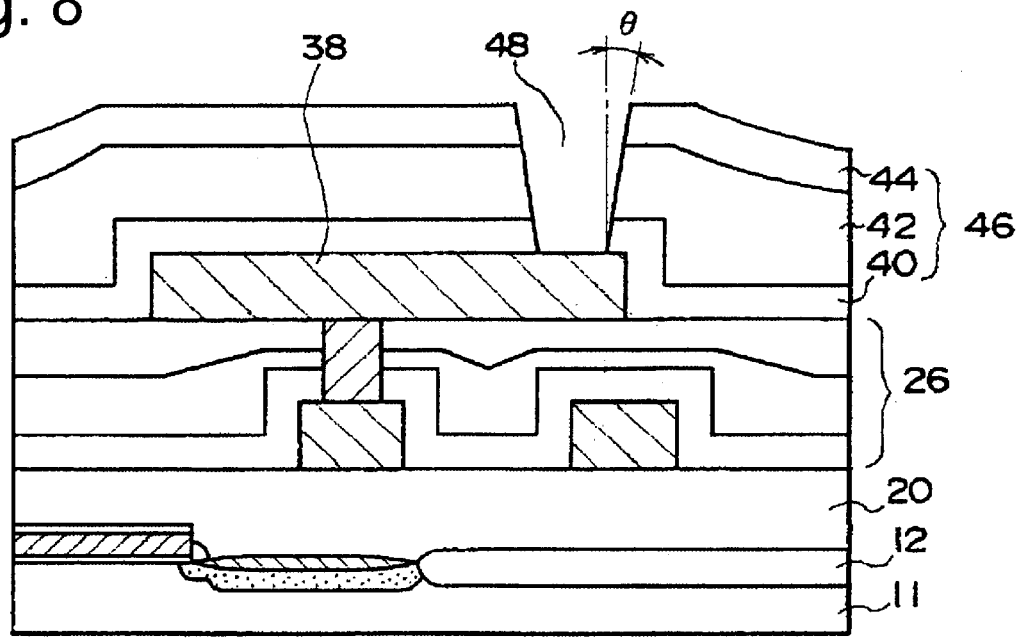
FIG. 8 shows a seventh step in the process for making the semiconductor device in cross-section in accordance with the first embodiment of the present invention.

Referring to FIG. 8, the silicon oxide films 40, 42 and 44 that form the interlayer dielectric film 46 are selectively anisotropically etched using a reactive ion etcher containing $CHF_3$ and $CF_4$ as main gases. As a result, a first through hole 48 having an aperture diameter of about 0.3–0.5 μm is formed.

The through hole 48 has a tapered side surface in which the cross-section of the through hole linearly reduces from its upper end section toward its bottom section. Taper angle θ may vary depending on etching conditions. However, for example, the taper angle θ is about 5–15 degrees. Such a tapered through hole is formed by the following reasons. First, the silicon oxide films 40, 42 and 44 present generally the same etching speed. However, the first silicon oxide film 42 presents an etching speed slightly slower than that of the fourth silicon oxide film 44. Secondly, boundary surfaces of the silicon oxide films are bonded to each other very well. Aluminum films can be deposited very well in the tapered through hole 48, as will be described below.

Dry etching speeds for the silicon oxide films measured by the inventors of the present invention are shown below. The dry etching is performed with a power being 800 W, a pressure being 20 Pa and etchant gases containing $CF_4$, $CHF_3$ and He in a ratio of 1:2:9.

| | |
|---|---|
| First silicon oxide film 42: | 525 nm/min |
| Fourth silicon oxide film 44: | 550 nm/min |
| Third silicon oxide film 40: | 500 nm/min |

Heat treatment including a degasification process will be described below. Lamp heating (heat treatment A) is conducted in a lamp chamber under base pressures of about $1.5 \times 10^{-4}$ Pa or lower, at temperatures of about 150–350° C. and, more preferably at temperatures of about 150–250° C., for about 30–60 seconds. Then, in another chamber where argon gas is introduced at pressures of about $1 \times 10^{-1}$–15× $10^{-1}$ Pa, a heat treatment (degasification step: heat treatment B) is conducted at temperatures of about 300–500° C. for about 30–300 seconds to thereby perform a degasification process.

In this process, first, the entire wafer, including its rear surface and side surface, is heat treated in the heat treatment A to remove water content that adheres to the wafer, as a primary object.

Then, in the heat treatment B, mainly, gasification components ($H$, $H_2O$) in the first silicon oxide film 42 that forms the interlayer dielectric film 46 are removed. As a result, generation of gasification components from the interlayer dielectric film 46 can be prevented during film formation of a barrier layer and an aluminum film conducted in later steps.

In accordance with an embodiment of the present invention, a wetting layer, such as, for example, a Ti film, may be formed. Such a film contains several ten atom % of gasification components (O, H, $H_2O$, N) in solid solution. Accordingly, removal of the gasification components in the interlayer dielectric film 46 before forming the wetting layer is very effective in successfully forming aluminum films in the through hole 48. Unless the gasification components are sufficiently removed from the interlayer dielectric film 46 below the wetting layer, the gasification components in the interlayer dielectric film 46 may be discharged and enter the wetting layer at a film formation temperature for forming the wetting layer (normally 300° C. or higher). Further, the gases are separated from the wetting layer when an aluminum film is formed and come out into a boundary between the wetting layer and the aluminum film, causing deteriorating effects on cohesiveness and flowability of the aluminum layer.

Referring to FIG. 1, a titanium film serving as a wetting layer 50 is formed to a film thickness of about 20–70 nm by a sputtering method. The sputtering is conducted at temperatures of about 200–450° C. depending on the film thickness.

Referring to FIG. 1, before cooling the wafer, heat treatment (heat treatment C) is conducted first in a lamp chamber under base pressures of about $1.5 \times 10^{-4}$ Pa or lower at temperatures of about 150–250° C. for about 30–60 seconds to remove substances such as water adhered to the substrate. Then, before an aluminum film is formed, the substrate temperature is lowered to about 100° C. or lower and, more preferably to the normal temperature –50° C. This cooling step is important to lower the temperature of the substrate which has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric film 46, the wetting layer 50 and the entire surface of the wafer at the time of film formation of a first aluminum film 52 is reduced to a minimum. As a result, this prevents deteriorating effects of the gases which may be adsorbed on the boundary between the wetting layer 50 and the first aluminum film 52 to thereby damage their coverage and cohesiveness.

Referring to FIG. 1, first, a first aluminum film 52 is formed by sputtering aluminum containing about 0.2–1.0 weight % of copper at a high speed at temperatures of about 200° C. or lower and, more preferably at about 30–100° C. to a film thickness of about 150–300 nm. Then, the substrate temperature is elevated to about 420–460° C. in the same chamber, and aluminum similarly containing copper is sputtered at a low speed to form a second aluminum film 54 having a film thickness of about 300–600 nm. In this film formation step, the level of "high speed" for film formation of the aluminum films may vary depending on the film forming condition and design specifications of a device to be manufactured. However, in this embodiment, the term "high speed" refers to sputtering speeds of about 10 nm/second or faster, and the term "low speed" refers to sputtering speeds of about 3 nm/second or slower.

Figure 9:
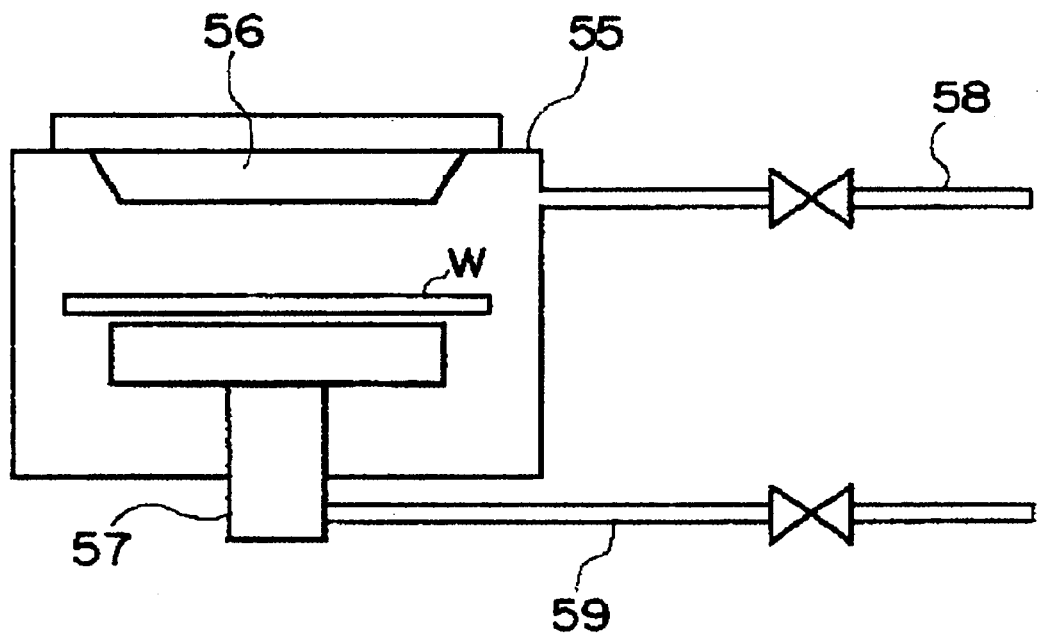
FIG. 9 schematically shows an example of a sputtering apparatus used for embodiments of the present invention.

FIG. 9 schematically shows an example of a sputter apparatus that is used to form the first and second aluminum films 52 and 54. The sputter apparatus has a chamber 55, a target 56 functioning also as an electrode and an electrode 57 functioning as a stage. A substrate (wafer) W to be processed is mounted on the electrode 57. A first gas supply channel 58 is connected to the chamber 55. A second gas supply channel 59 is connected to the electrode 57. Both of the gas supply channels 58 and 59 supply argon gas. The temperature of the wafer W is controlled by a gas supplied through the second gas supply channel 59. An exhaust system (not shown) may be provided to exhaust gasses from the chamber 55.

Figure 10:
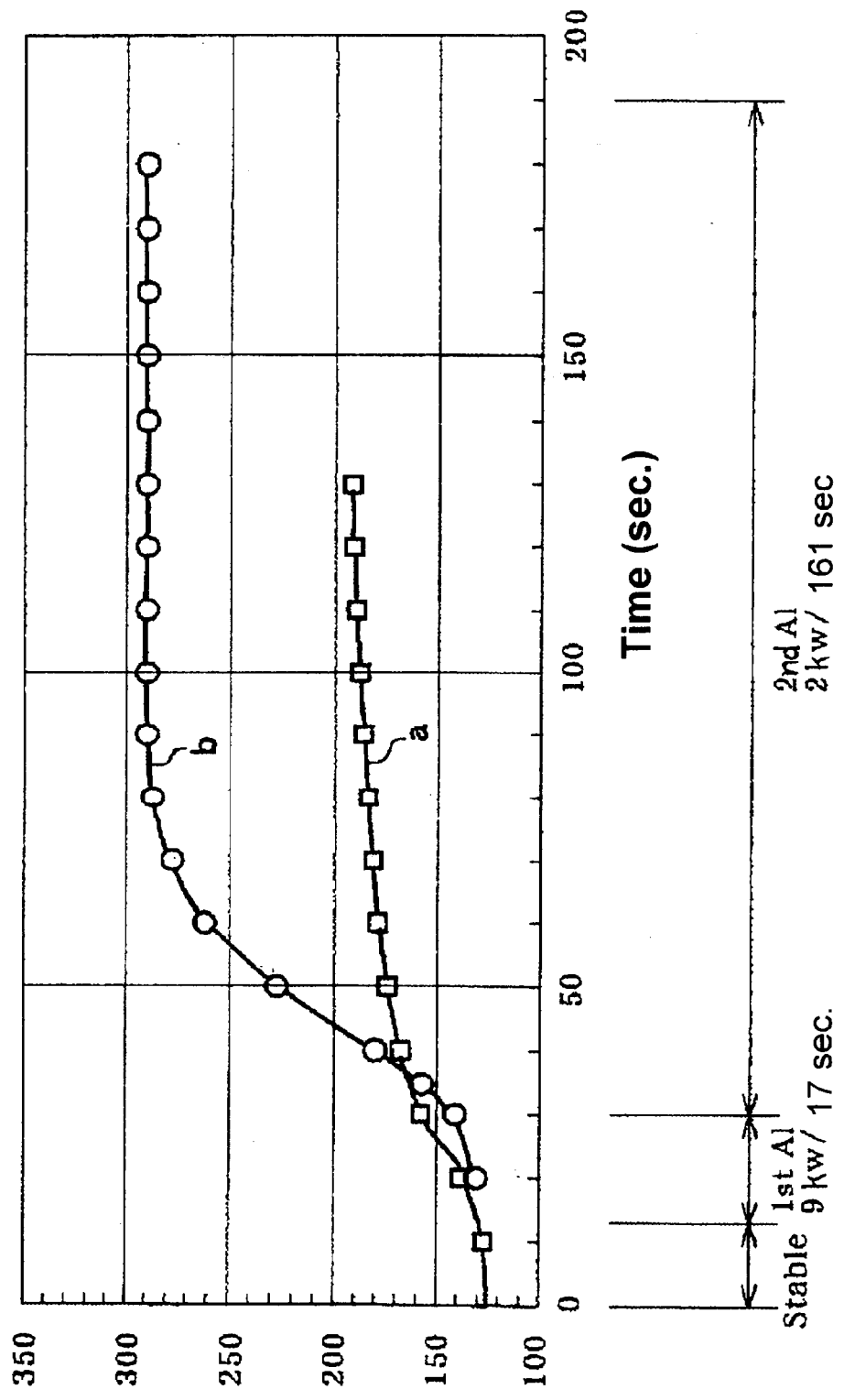
FIG. 10 shows relations between elapsed time and substrate temperatures when the substrate temperature is controlled using the sputtering apparatus shown in FIG. 9.

One example for controlling the substrate temperature by the sputter apparatus is illustrated in FIG. 10. In FIG. 10, elapsed time is presented along the axis of abscissa, and substrate (wafer) temperatures are presented along the axis of ordinate. A line marked by reference "a" represents changes in the substrate temperature when the stage 57 of the sputtering apparatus is set at 350° C. A line marked by reference "b" represents changes in the substrate temperature when the temperature of the stage 57 is increased by supplying high temperature argon gas through the second gas supply channel 59 into the chamber.

For example, the substrate temperature is controlled as follows. The stage 57 is. pre-heated and its temperature is set at a film forming temperature for forming the second aluminum film (at about 350–500° C.). When the first aluminum film is formed, the substrate temperature is gradually elevated by heat of the stage 57 without gas supply from the second gas supply channel 59, as indicated by the line marked by reference "a" shown in FIG. 10. When the second aluminum film is formed, the substrate temperature is controlled to rapidly rise by supplying heated gas through the second gas supply channel 59, and then to stabilize at a predetermined temperature level, as indicated by the line marked by reference "b" shown in FIG. 10.

In the example shown in FIG. 10, the temperature of the stage is set at 350° C., and the first aluminum film 52 is formed while the substrate temperature is set at 125–150° C., and immediately thereafter, the film formation of the second aluminum film 54 is conducted.

In the process of forming the aluminum films, control of power applied to the sputtering apparatus is important as well as control of film forming speed and substrate temperature. In other words, the first aluminum film 52 is formed with high power, and the second aluminum film 54 is formed with lower power, although it depends on the film forming speed. Most importantly, the power should not be reduced to zero when the power is switched from the high power to the lower power. If the power is reduced to zero, an oxide film is formed on the surface of the first aluminum film even under a reduced pressure, and the wettability of the second aluminum film with respect to the first aluminum film is lowered, and bonding between the films is deteriorated. In other words, by continuously applying power, active aluminum is continuously supplied onto the surface of the aluminum film during the film formation, and formation of an oxide film is suppressed. The level of power is preferably set at about 5–10 kW for the high power and at about 300 W–1 kW for the lower power, for example, under the temperature condition shown in FIG. 10, although it may vary depending on the sputtering apparatus and film forming conditions.

By successively forming the first aluminum film 52 and the second aluminum film 54 in the same chamber, the temperature and the power can be precisely controlled and stable aluminum films are effectively formed at a lower temperature than the conventional method.

The thickness of the first aluminum film 52 is selected to be in an appropriate range in consideration of the capability of forming successive layers with good step coverage and the capability of controlling discharge of gasification components from the wetting layer 50 and the interlayer dielectric film 46 below the aluminum film 52. For example, the thickness may preferably be about 100–300 nm. The thickness of the second aluminum film 54 is determined by factors such as the size of the through hole 48 and its aspect ratio. For example, the thickness of about 300–800 nm is necessary to cover a through hole smaller than about 0.5 μm or less in diameter with aspect ratio of about 3.

Further, an anti-reflection film 62 with a film thickness of about 30–80 nm is formed by sputter-depositing titanium nitride (TiN) in another sputter chamber.

Then, a laminated layer of the wetting layer 50, the first aluminum film 52, the second aluminum film 54 and the anti-reflection film 62 is selectively etched by an anisotropic dry etcher mainly containing $Cl_2$ and $BCl_3$ gases to thereby form a third metal wiring layer 64.

It has been confirmed that, in the third metal wiring layer 64 formed in this manner, the through hole 48 with an aspect ratio of about 0.5–3.0 and the aperture diameter of about 0.2–0.8 μm is filled by the aluminum with good step coverage without creating voids.

Some of the effects obtained by the embodiments of the present invention are described below.

(1) As shown in FIG. 1, in accordance with the first embodiment, the interlayer dielectric films include the interlayer dielectric film 26 that has an internal compression stress and the interlayer dielectric film 46 that has an internal tensile stress. As a result, when semiconductor devices are manufactured with a semiconductor wafer, tensile stress and compression stress act in the semiconductor wafer. As a consequence, stresses acting in the semiconductor wafer can be reduced to zero or to a small level, such that warping of the semiconductor wafer is eliminated or reduced when semiconductor devices are manufactured. For example, the silicon oxide films 28 and 32 that form the interlayer dielectric film 26 have an internal compression stress of about 200–400 Mpa. On the other hand, the first silicon oxide film 42 that forms the interlayer dielectric film 46 has an internal tensile stress of about 200–400 Mpa.

(2) As shown in FIG. 7, in accordance with the first embodiment, the first silicon oxide film 42 containing silanol is formed by reacting a silicon compound and hydrogen peroxide in the vapor phase. As a result, the interlayer dielectric film 46 with an excellent planarization is formed. Accordingly, process margins in processes including wiring layer processing are improved, and manufacturing quality and yield are improved.

In particular, when the interlayer dielectric film 46 is formed between the main surface of the silicon substrate 11 and the first metal wiring layers 22 and 24 (i.e., at a location where the interlayer dielectric film 20 is formed), the following effects are achieved. The interlayer dielectric film 46 is planarized at substantially lower temperatures compared to the temperature in forming a conventional BPSG film. As a result, device characteristics against punch-through and junction leaks are improved, and further device miniaturization of device elements with highly reliable contact structures is achieved. Also, it is advantageous with respect to the manufacturing process.

(3) In accordance with the first embodiment, at least a degasification process and a cooling process are conducted before sputtering aluminum films, and the aluminum films are continuously formed in the same chamber. As a result, through holes 48 having an aperture diameter of about 0.2 μm can be filled only with aluminum or an aluminum alloy. As a result, the device reliability and production yield are improved. Also, it has been confirmed that the aluminum films forming the contact section do not have partial precipitation of copper or abnormal growth of crystal grains, and are highly reliable in various aspects including migration and the like.

In the first embodiment, it is believed that the first and second aluminum films 52 and 54 are embedded well in the through hole 48 due to the following reasons.

(a) By performing the degasification process, water and nitrogen contained in the interlayer dielectric film 46 are gasified and sufficiently discharged. As a result, generation of gases from the interlayer dielectric film 46 and the wetting layer 50 is prevented when the first aluminum films 52 and 54 are formed in later steps. As a consequence, the wetting layer 50 and the first aluminum film 52 can be formed with high coherency and therefore good step coverage.

(b) The substrate temperature is set at a relatively low temperature that is about 200° C. or lower when the first aluminum film 52 is formed. As a result, water and nitrogen contained in the interlayer dielectric film 46 and the wetting layer 50 are prevented from being discharged, with the result that the coherency of the first aluminum film 52 is further increased in addition to the effect provided by the degasification process.

(c) Further, the first aluminum film 52 itself plays a role to restrict generation of gasses from the underlying layers when the substrate temperature rises. As a result, the second aluminum film 54 can be formed at a relatively high temperature, and therefore flow and diffusion can be optimally conducted for the second aluminum film.

The present invention is not limited to the first embodiment. A part thereof can be replaced with the following means.

{1} In the first embodiment, when the fourth silicon oxide film 44 is formed by a plasma CVD method, nitrogen monoxide is used as a compound including oxygen. In an alternative embodiment, ozone may be used instead. The wafer may preferably be exposed to an ozone atmosphere before the fourth silicon oxide film 44 is formed.

Figure 11:
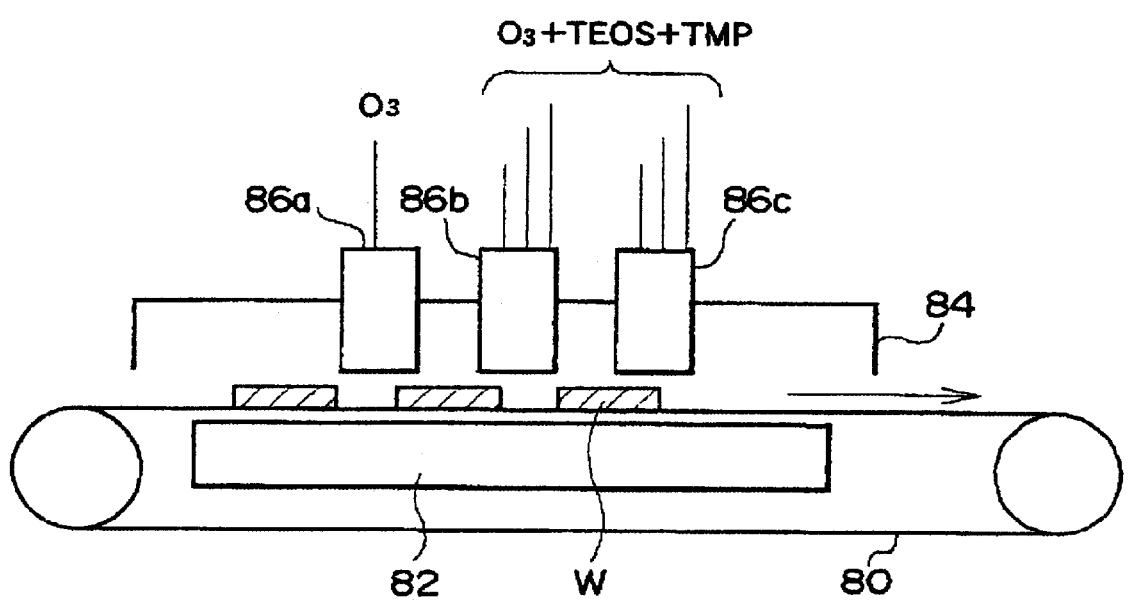
FIG. 11 schematically shows a belt furnace used for embodiments of the present invention.

For example, a belt furnace having a heater 82, as shown in FIG. 11, is employed. A wafer W is placed on a conveyor belt 80 that is heated at about 400–500° C. by the heater 82 and conveyed at a predetermined transfer speed. In this instance, ozone is supplied through a first gas head 86a, such that the wafer W is transferred in an ozone atmosphere containing about 2–8 weight % ozone for a time period of about 5 minutes or longer. Then, ozone, TEOS and TMP (P(OCH$_3$)$_3$) are supplied through second and third gas heads 86b and 86c under generally normal pressure to form a PSG film (the fourth silicon oxide film) 44 to a film thickness of about 100–600 nm with a concentration of about 3–6 weight % phosphorous contained therein. Reference numeral 84 in FIG. 11 denotes a cover.

By using ozone instead of nitrogen monoxide, a silicon oxide film can be formed with TEOS by a normal pressure CVD. Also, by the use of a belt furnace, film formation steps are successively and effectively conducted.

Also, by exposing the wafer W to an ozone atmosphere, it has been confirmed by a thermal desorption spectroscopy (TDS) and a Fourier-transform infrareds spectroscopy (FTIR) that the first silicon oxide film 42 has a low moisture absorption characteristic and contains a sufficiently low level of water content. Further, the interlayer dielectric film 46 has a good planarization characteristic comparable to the one formed by using nitrogen monoxide as a reactive gas. Also, the first silicon oxide film 42 does not generate cracks.

{2} In the first embodiment, a silicon oxide film as the third silicon oxide film 40 is formed by a plasma CVD using TEOS. Other types of silicon oxide films may be used instead. For example, as the third silicon oxide film, a film may be formed by a reduced-pressure thermal CVD using monosilane and nitrogen monoxide. The silicon oxide film thus formed faithfully follows the surface contour of the underlying layer, and has a high degree of coverage characteristic. Moreover, the film is dense and therefore has a high passivation characteristic. Also, cracks are difficult to occur in the first silicon oxide film 42 even when anneal temperature is rapidly raised in an anneal treatment. Further, the thermal CVD method provides an advantage in that plasma damages are not caused.

{3} In the first embodiment, the interlayer dielectric film 46 consists of three layers of silicon oxide films. The present invention is not limited to this structure, and other silicon oxide films may be added. For example, a PSG film (with a concentration of about 1–6 weight % phosphorous contained therein) may be formed to a film thickness of about 100–300 nm by a plasma CVD between the third silicon oxide film 40 and the first silicon oxide 42. It has been confirmed that the gettering function against mobile ions is further improved by inserting the PSG film. Also, by the insertion of the PSG film, internal stresses of the third silicon oxide film 40 that affect the first silicon oxide film 42 are reduced, and internal stresses of the first silicon oxide film 42 that affect the third silicon oxide film 40 are reduced.

For example, when the fourth silicon oxide film 44 has a sufficiently high level of planarization, a thick silicon oxide film may be formed on the fourth silicon oxide film 44, and the thick silicon oxide film is further planarized by chemical-mechanical polishing (CMP).

{4} In the first embodiment, the interlayer dielectric film 26 having an internal compression stress is formed between the first metal wiring layers 22 and 24 and the second metal wiring layer 38. Also, the interlayer dielectric film 46 having an internal tensile stress is formed between the second metal wiring layer 38 and the third metal wiring layer 64.

However, the present invention is not limited to this embodiment. For example, an interlayer dielectric film having an internal tensile stress may be formed between the first metal wiring layers 22 and 24 and the second metal wiring layer 38. An interlayer dielectric film having an internal compression stress may be formed between the second metal wiring layer 38 and the third metal wiring layer 64.

{5} The first embodiment is described with reference to a structure in which the interlayer dielectric film 46 having an internal tensile stress is formed between the metal wiring layers. However, the present invention is not limited to this embodiment. For example, an interlayer dielectric film having an internal tensile stress may be formed between a main surface of a silicon substrate and a metal wiring layer.

{6} The first embodiment is described with reference to three wiring layers (the first, second and third metal wiring layers). However, the present invention is not limited to this embodiment, and is applicable to four or more wiring layers. For example, the following embodiment is possible.

In one embodiment, a semiconductor apparatus may have four firing layers (first, second, third and fourth metal wiring layers in the order from below). An interlayer dielectric film having an internal compression stress may be formed between the first metal wiring layer and the second metal wiring layer. The interlayer dielectric film defines a through hole, which is filled with a plug composed of a high melting point metal. Interlayer dielectric films having an internal tensile stress may be formed between the second metal wiring layer and the third metal wiring layer and between the third metal wiring layer and the fourth metal wiring layer, respectively. Through holes defined in these interlayer dielectric films are filled with aluminum films.

In another embodiment, layers may be reversed. More specifically, an interlayer dielectric film having an internal tensile stress may be formed between the first metal wiring layer and the second metal wiring layer. The interlayer dielectric film defines a through hole, which is filled with an aluminum film. Interlayer dielectric films having an internal compression stress may be formed between the second metal wiring layer and the third metal wiring layer and between the third metal wiring layer and the fourth metal wiring layer, respectively. Through holes defined in these interlayer dielectric films are filled with plugs composed of a high melting point metal.

In accordance with one embodiment of the present invention, a semiconductor device may include five metal wiring layers (first, second, third, fourth and fifth metal wiring layers in the order from below). In this case, interlayer dielectric films having an internal compression stress may be formed between the first metal wiring layer and the second metal wiring layer and between the fourth metal wiring layer and the fifth metal wiring layer, respectively. The interlayer dielectric films define through holes, which are filled with plugs composed of a high melting point metal. Interlayer dielectric films having an internal tensile stress may be formed between the second metal wiring layer and the third metal wiring layer and between the third metal wiring layer and the fourth metal wiring layer. The interlayer dielectric films define through holes, which are filled with aluminum films.

In another embodiment, layers may be reversed. More specifically, interlayer dielectric films having an internal tensile stress may be formed between the first metal wiring layer and the second metal wiring layer and between the fourth metal wiring layer and the fifth metal wiring layer, respectively. The interlayer dielectric films define through holes, which are filled with aluminum films. Interlayer dielectric films having an internal compression stress may be formed between the second metal wiring layer and the third metal wiring layer and between the third metal wiring layer and the fourth metal wiring layer. The interlayer dielectric films define through holes, which are filled with plugs composed of a high melting point metal.

{7} In the first embodiment, the interlayer dielectric film 26 having an internal compression stress is formed by the steps shown in FIGS. 4 and 5. However, the present invention is not limited to this embodiment. Steps of forming a high-density plasma CVD oxide film using ICP (Inductively Couple Plasma) and ECR (Electron Cyclotron Resonance), and steps of sputter-etching the formed film may be repeated, such that a space between adjacent metal wiring layers is filled with the high-density plasma CVD oxide film. Then, the high-density plasma CVD oxide film may be planarized by chemical-mechanical polishing.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for manufacturing a semiconductor device, the semiconductor device comprising a semiconductor substrate having a main surface, a plurality of wiring layers formed over the main surface, and a plurality of interlayer dielectric films formed over the main surface, wherein the plurality of interlayer dielectric films includes at least a first dielectric film and a second dielectric film, the method comprising at least the steps of:

(a) reacting a silicon compound with hydrogen peroxide by a CVD method to form the first dielectric film composed of a silicon oxide film having an internal tensile stress; and (b) forming the second dielectric film having an internal compression stress.

2. A method for manufacturing a semiconductor device according to claim 1, wherein the second dielectric film is a silicon oxide film formed by a CVD method.

3. A method for manufacturing a semiconductor device according to claim 1, wherein the step of forming the first dielectric film includes, before the step (a), the step (c) of reacting a silicon compound with at least one of oxygen and a compound including oxygen by a CVD method to form a third silicon oxide film that serves as a base layer below the first dielectric film.

4. A method for manufacturing a semiconductor device according to claim 1, wherein the step of forming the first dielectric film includes, after the step (a), a step (d) of reacting a silicon compound with at least one of oxygen and a compound including oxygen by a CVD method to form a fourth porous silicon oxide film on the first dielectric film.

5. A method for manufacturing a semiconductor device according to claim 1, after forming the first dielectric film, further comprising the steps of:

(e) forming a first through hole in the first dielectric film;

(f) forming a barrier layer, that defines a part of the wiring layers, on a surface of the first through hole and on a surface of the first dielectric film; and (g) forming a conductive film, that forms a part of the wiring layers, on a surface of the barrier layer.

6. A method for manufacturing a semiconductor device according to claim 5, wherein the first through hole has an upper end section, a bottom end section and a tapered wall between the upper end section and the bottom end section wherein aperture diameters thereof become smaller from the upper end section toward the bottom end section thereof.

7. A method for manufacturing a semiconductor device according to claim 5, wherein the conductive film is provided by forming a first aluminum film formed from aluminum or an alloy containing aluminum as a main component at temperatures of about 200° C. or lower, and then, forming a second aluminum film formed from aluminum or an alloy containing aluminum as a main component at temperatures of about 300° C. or higher.

8. A method for manufacturing a semiconductor device according to claim 1, wherein the silicon compound used in the step (a) is at least one selected from a group containing inorganic silane compounds and organo silane compounds.

9. A method for manufacturing a semiconductor device according to claim 1, wherein the silicon compound used in the step (a) is at least one selected from a group of inorganic silane compounds including monosilane, disilane, $SiH_2Cl_2$ and $SiF_4$, and a group of organo silane compounds including $CH_3SiH_3$, tripropylesilane, tetraethylorthosilicate.

10. A method for manufacturing a semiconductor device according to claim 8, wherein the step (a) uses an inorganic silane compound as the silicon compound and is conducted at temperatures ranging from about 0° C. to about 20° C. by a reduced pressure CVD method.

11. A method for manufacturing a semiconductor device according to claim 8, wherein the step (a) uses an organic silane compound as the silicon compound and is conducted at temperatures ranging from about 0° C. to about 150° C. by a reduced pressure CVD method.

12. A method for manufacturing a semiconductor device according to claim 4, wherein the step (d) is conducted at temperatures ranging from about 300° C. to about 450° C. by a plasma CVD method.

13. A method for manufacturing a semiconductor device according to claim 12, wherein the compound containing oxygen used in the step (d) is nitrogen monoxide.

14. A method for manufacturing a semiconductor device according to claim 4, wherein the step (d) is conducted at temperatures ranging from about 300° C. to about 550° C. by a normal pressure CVD method.

15. A method for manufacturing a semiconductor device according to claim 14, wherein the compound containing oxygen used in the step (d) is ozone.

16. A method for manufacturing a semiconductor device according to claim 4, wherein, in the step (d), the first silicon oxide film is exposed to an ozone atmosphere before the fourth silicon oxide film is formed.

17. A method for manufacturing a semiconductor device according to claim 1, wherein, after the second dielectric film is formed, the second dielectric film is polished by a CMP method to planarize a top surface thereof.

18. A method for manufacturing a semiconductor device, the semiconductor device comprising a semiconductor substrate having a main surface, a plurality of wiring layers over the main surface, and interlayer dielectric films formed between the main surface and the plurality of wiring layers and between the wiring layers,
   wherein at least one of the interlayer dielectric films is an interlayer dielectric film including a first silicon oxide film, and
   at least another of the interlayer dielectric films is an interlayer dielectric film including a second silicon oxide film, the method comprising at least the steps of:
      (a) reacting a silicon compound with hydrogen peroxide by a CVD method to form the first silicon oxide film having an internal tensile stress; and
      (b) forming by a CVD method the second silicon oxide film having an internal compression stress.

19. A method for manufacturing a semiconductor device according to claim 18, wherein the step of forming the interlayer dielectric film including the first silicon oxide film includes, before the step (a), a step (c) of reacting a silicon compound with at least one of oxygen and a compound including oxygen by a CVD method to form a third silicon oxide film that serves as a base layer.

20. A method for manufacturing a semiconductor device according to claim 18, wherein the step of forming the interlayer dielectric film including the first silicon oxide film includes, after the step (a), a step (d) of reacting a silicon compound with at least one of oxygen and a compound including oxygen by a CVD method to form a fourth porous silicon oxide film.

21. A method for manufacturing a semiconductor device according to claim 18, after forming the interlayer dielectric film including the first silicon oxide film, further comprising the steps of:
   (e) forming a first through hole in the interlayer dielectric film including the first silicon oxide film;
   (f) forming a barrier layer, that defines a part of the wiring layers, on a surface of the first through hole and on a surface of the interlayer dielectric film; and
   (g) forming a conductive film, that forms a part of the wiring layers, on a surface of the barrier layer.

22. A method for manufacturing a semiconductor device according to claim 21, wherein the first through hole has a tapered shape wherein aperture diameters thereof become smaller from an upper end section thereof toward a bottom end section thereof.

23. A method for manufacturing a semiconductor device according to claim 21, wherein the conductive film is provided by forming a first aluminum film formed from aluminum or an alloy containing aluminum as a main component at temperatures of about 200° C. or lower, and then, forming a second aluminum film formed from aluminum or an alloy containing aluminum as a main component at temperatures of about 300° C. or higher.

24. A method for manufacturing a semiconductor device according to claim 18, wherein the silicon compound used in the step (a) is at least one selected from a group containing inorganic silane compounds and organo silane compounds.

25. A method for manufacturing a semiconductor device according to claim 18, wherein the silicon compound used in the step (a) is at least one selected from a group of inorganic silane compounds including monosilane, disilane, $SiH_2Cl_2$ and $SiF_4$, and a group of organo silane compounds including $CH_3SiH_3$, tripropylesilane, tetraethylorthosilicate.

26. A method for manufacturing a semiconductor device according to claim 24, wherein the step (a) uses an inorganic silane compound as the silicon compound and is conducted at temperatures ranging from about 0° C. to about 20° C. by a reduced pressure CVD method.

27. A method for manufacturing a semiconductor device according to claim 24, wherein the step (a) uses an organic silane compound as the silicon compound and is conducted at temperatures ranging from about 0° C.–150° C. by a reduced pressure CVD method.

28. A method for manufacturing a semiconductor device according to claim 20, wherein the step (d) is conducted at temperatures ranging from about 300 to about 450° C. by a plasma CVD method.

29. A method for manufacturing a semiconductor device according to claim 28, wherein the compound containing oxygen used in the step (d) is nitrogen monoxide.

30. A method for manufacturing a semiconductor device according to claim 20, wherein the step (d) is conducted at temperatures ranging from about 300° C. to about 550° C. by a normal pressure CVD method.

31. A method for manufacturing a semiconductor device according to claim 30, wherein the compound containing oxygen used in the step (d) is ozone.

32. A method for manufacturing a semiconductor device according to claim 20, wherein, in the step (d), the first silicon oxide film is exposed to an ozone atmosphere before the fourth silicon oxide film is formed.

33. A method for manufacturing a semiconductor device according to claim 18, wherein, after the interlayer dielectric film including the second silicon oxide film is formed, the interlayer dielectric film is polished by a CMP method.

34. A method for manufacturing a semiconductor device according to claim 1, wherein a magnitude of the internal tensile stress is approximately equal to a magnitude of the internal compression stress.

35. A method for manufacturing a semiconductor device according to claim 18, wherein a magnitude of the internal tensile stress is approximately equal to a magnitude of the internal compression stress.

36. A method for manufacturing a semiconductor device according to claim 1, wherein step (a) further comprises:
   polycondensation reacting a silicon compound with hydrogen peroxide by a CVD method to form the first dielectric film composed of a silicon oxide film having an internal tensile stress, wherein the first dielectric film is part of the first interlayer dielectric film.

37. A method for manufacturing a semiconductor device according to claim 1, wherein step (a) further comprises, comprises:

polycondensation reacting a silicon compound with hydrogen peroxide by a CVD method to form the first silicon oxide film having an internal tensile stress, wherein the first silicon oxide film is part of the first interlayer dielectric film.

38. A method for manufacturing a semiconductor device, the semiconductor device comprising a semiconductor substrate having a main surface, a plurality of wiring layers formed over the main surface, and a plurality of interlayer dielectric films formed over the main surface, wherein at least one of the plurality of interlayer dielectric films is multi-layered and includes at least one of a first dielectric film and a second dielectric film, the method comprising:

(a) reacting a silicon compound with hydrogen peroxide by a CVD method to form the first dielectric film composed of a silicon oxide film having an internal tensile stress; and (b) forming the second dielectric film having an internal compression stress.

39. A method for manufacturing a semiconductor device according to claim 38, wherein the plurality of interlayer dielectric films includes a first interlayer dielectric film including at least a first dielectric film and a second interlayer dielectric film including at least a second dielectric film, and wherein one of the first interlayer dielectric film and the second interlayer dielectric film is multilayered.

40. A method for manufacturing a semiconductor device according to claim 38, wherein the first interlayer dielectric film is multi-layered, and wherein the step (a) comprises:

(a) reacting a silicon compound with hydrogen peroxide by a CVD method to form the first dielectric film composed of a silicon oxide film having an internal tensile stress, wherein the first dielectric film comprises at least one layer of the first interlayer dielectric film.

41. A method for manufacturing a semiconductor device according to claim 38, wherein the second interlayer dielectric film is multi-layered, and wherein the step (b) comprises:

(b) forming the second dielectric film having an internal compression stress, wherein the second dielectric film comprises at least one layer of the second interlayer dielectric film.

42. A method for manufacturing a semiconductor device according to claim 38, wherein both the first interlayer dielectric film and the second interlayer dielectric film are multi-layered, and wherein steps (a) and (b) comprise:

(a) reacting a silicon compound with hydrogen peroxide by a CVD method to form the first dielectric film composed of a silicon oxide film having an internal tensile stress, wherein the first dielectric film comprises at least one layer of the first interlayer dielectric film; and (b) forming the second dielectric film having an internal compression stress, wherein the second dielectric film comprises at least one layer of the second interlayer dielectric film.

43. A method for manufacturing a semiconductor device, the semiconductor device comprising a semiconductor substrate having a main surface, a plurality of wiring layers formed over the main surface, and a plurality of interlayer dielectric films formed over the main surface, wherein the plurality of interlayer dielectric films includes a first interlayer dielectric film at least a first dielectric film and a second film, the method comprising at least the steps of:

(a) reacting a silicon compound with hydrogen peroxide by a CVD method to form the first dielectric film composed of a silicon oxide film having an internal tensile stress, wherein each of the interlayer dielectric films are multi-layered and the first silicon oxide film comprises at least one layer of the first interlayer dielectric film; and (b) forming the second film having an internal compression stress.

44. A method for manufacturing a semiconductor device, the semiconductor device comprising a semiconductor substrate having a main surface, a plurality of wiring layers over the main surface, and interlayer dielectric films formed between the main surface and the plurality of wiring layers and between the wiring layers, wherein at least one of the interlayer dielectric films is a first interlayer dielectric film including a first silicon oxide film, and at least another of the interlayer dielectric films is a second interlayer dielectric film including a second film, the method comprising at least the steps of:

(a) reacting a silicon compound with hydrogen peroxide by a CVD method to form the first silicon oxide film having an internal tensile stress, wherein each of the interlayer dielectric films are multi-layered and the first silicon oxide film comprises at least one layer of the first interlayer dielectric film; and (b) forming by a CVD method the second film having an internal compression stress.

45. A method for manufacturing a semiconductor device, comprising:

providing a semiconductor substrate having a main surface;

providing a multi-layered interlayer dielectric film over the main surface, wherein the multi-layered interlayer dielectric film includes a first silicon oxide film layer having an internal tensile stress; and providing a second interlayer dielectric film over the main surface, the second interlayer dielectric film having an internal compression stress.

46. A method for manufacturing a semiconductor device according to claim 45, wherein the first silicon oxide film layer is formed by reacting a silicon compound with hydrogen peroxide by a CVD method.

47. A method for manufacturing a semiconductor device according to claim 45, wherein a magnitude of the internal tensile stress is approximately equal to a magnitude of the internal compression stress.

* * * * *